(12) United States Patent
Imaoka

(10) Patent No.: US 6,872,081 B2
(45) Date of Patent: Mar. 29, 2005

(54) ELECTRONIC DEVICE, METHOD OF MANUFACTURING THE SAME AND METHOD OF DESIGNING THE SAME, AND CIRCUIT BOARD AND ELECTRONIC INSTRUMENT

(75) Inventor: Norio Imaoka, Takamori-machi (JP)

(73) Assignee: Seiko Epson Corporation, Tokyo (JP)

( * ) Notice: Subject to any disclaimer, the term of this patent is extended or adjusted under 35 U.S.C. 154(b) by 336 days.

(21) Appl. No.: 10/201,777

(22) Filed: Jul. 25, 2002

(65) Prior Publication Data

US 2003/0022558 A1 Jan. 30, 2003

(30) Foreign Application Priority Data

Jul. 27, 2001 (JP) ........................................ 2001-227651

(51) Int. Cl.[7] .............................................. H01R 12/00
(52) U.S. Cl. ........................................ 439/65; 349/149
(58) Field of Search ................................ 349/149–152; 439/65

(56) References Cited

U.S. PATENT DOCUMENTS

| | | | | | |
|---|---|---|---|---|---|
| 5,499,131 | A | * | 3/1996 | Kim | 349/149 |
| 5,612,804 | A | * | 3/1997 | Hara | 349/149 |
| 5,757,450 | A | * | 5/1998 | Fujii et al. | 349/106 |
| 5,825,450 | A | * | 10/1998 | Date et al. | 349/149 |
| 5,850,275 | A | * | 12/1998 | Watanabe et al. | 349/152 |
| 5,914,763 | A | * | 6/1999 | Fujii et al. | 349/149 |
| 6,052,170 | A | * | 4/2000 | Kobayashi | 349/149 |
| 6,104,465 | A | * | 8/2000 | Na et al. | 349/152 |
| 6,151,091 | A | * | 11/2000 | Muramatsu | 349/149 |
| 6,169,530 | B1 | * | 1/2001 | Mori et al. | 345/93 |
| 6,172,732 | B1 | * | 1/2001 | Hayakawa et al. | 349/152 |
| 6,300,997 | B1 | * | 10/2001 | Saito et al. | 349/149 |
| 6,587,176 | B2 | * | 7/2003 | Kim | 349/149 |
| 6,665,039 | B1 | * | 12/2003 | Glownia et al. | 349/153 |
| 6,678,028 | B2 | * | 1/2004 | Yamate et al. | 349/151 |
| 6,683,669 | B1 | * | 1/2004 | Fujikawa | 349/149 |
| 6,741,315 | B1 | * | 5/2004 | Uchiyama | 349/149 |
| 6,760,091 | B2 | * | 7/2004 | Uehara | 349/152 |
| 6,774,971 | B2 | * | 8/2004 | Shirato et al. | 349/150 |
| 6,778,247 | B2 | * | 8/2004 | Lee et al. | 349/149 |

FOREIGN PATENT DOCUMENTS

| | | |
|---|---|---|
| JP | A 3-200223 | 9/1991 |
| JP | A 10-260421 | 9/1998 |

* cited by examiner

*Primary Examiner*—Ross Gushi
(74) *Attorney, Agent, or Firm*—Oliff & Berridge, PLC

(57) ABSTRACT

An electronic device includes first and second electronic components. Each of terminals of a first group of the first electronic component is disposed on one of a plurality of first lines passing through a first point. Each of terminals of a second group of the second electronic component is disposed on one of a plurality of second lines passing through a second point. The first and second points coincide with each other, and the first and second lines overlap. The terminals of at least one of the first and second groups are formed to extend along first lines or second lines.

47 Claims, 13 Drawing Sheets

ELECTRONIC DEVICE, METHOD OF MANUFACTURING THE SAME AND METHOD OF DESIGNING THE SAME, AND CIRCUIT BOARD AND ELECTRONIC INSTRUMENT

Japanese Patent Application No. 2001-227651, filed on Jul. 27, 2001, is hereby incorporated by reference in its entirety.

BACKGROUND OF THE INVENTION

The present invention relates to an electronic device, a method of manufacturing the same and a method of designing the same, and a circuit board and an electronic instrument.

In the past, when many electrodes are connected to one another, such as in the case of a COF mounting in which a liquid crystal panel is connected to a flexible printed circuit board, electrical conduction cannot be secured if positional deviations occur. In particular, when electrodes are formed on a thin resin film such as a flexible printed circuit board, it is difficult to eliminate positional deviations among the electrodes because the resin film is apt to expand or contract due to heat and/or moisture.

BRIEF SUMMARY OF THE INVENTION

An electronic device according to one aspect of the present invention comprises a plurality of electronic components, wherein a first electronic component among the plurality of electronic components has a plurality of first terminals, wherein a second electronic component among the plurality of electronic components has a plurality of second terminals, wherein at least three terminals among the plurality of first terminals form a first group of terminals and at least three terminals among the plurality of second terminals form a second group of terminals, the first group of terminals and the second group of terminals being overlapped and electrically connected with one another, wherein each of the terminals in the first group is disposed on one of a plurality of first lines passing through a first point, wherein each of the terminals in the second group is disposed on one of a plurality of second lines passing through a second point, wherein the first and second points coincide with each other, and the first and second lines overlap, and wherein the terminals of at least one of the first and second groups are formed to extend along the first lines or the second lines.

A circuit board according to another aspect of the present invention includes the electronic device described above.

An electronic instrument according a further aspect of to the present invention includes the electronic device described above.

A method of manufacturing an electronic device according to a still further aspect of the present invention comprises:

positioning and electrically connecting a first group of terminals and a second group of terminals, the first group of terminals being formed of at least three terminals among a plurality of first terminals of a first electronic component and the second group of terminals being formed of at least three terminals among a plurality of second terminals of a second electronic component;

disposing each of the terminals in the first group on one of a plurality of first lines passing through a first point; and disposing each of the terminals in the second group on one of a plurality of second lines passing through a second point, wherein an arrangement of the plurality of first lines is identical with an arrangement of the plurality of second lines, wherein the terminals of at least one of the first and second groups are formed to extend along the first lines or the second lines, and wherein positioning the terminals in the first and second groups is performed by causing the first lines to overlap with the second lines.

A method of designing an electronic device according to a yet further aspect of the present invention comprises:

designing a plurality of first terminals of a first electronic component and a plurality of second terminals of a second electronic component;

designing each of the terminals in a first group formed of at least three terminals among the plurality of first terminals to be disposed on one of a plurality of first lines passing through a first point; and designing each of the terminals in a second group formed of three of more terminals among the plurality of second terminals to be disposed on one of a plurality of second lines passing through a second point, wherein an arrangement of the plurality of first lines is identical with an arrangement of the plurality of second lines, and wherein the terminals in at least one of the first and second groups are designed to extend along the first lines or the second lines.

DETAILED DESCRIPTION OF THE EMBODIMENT

Figure 1:
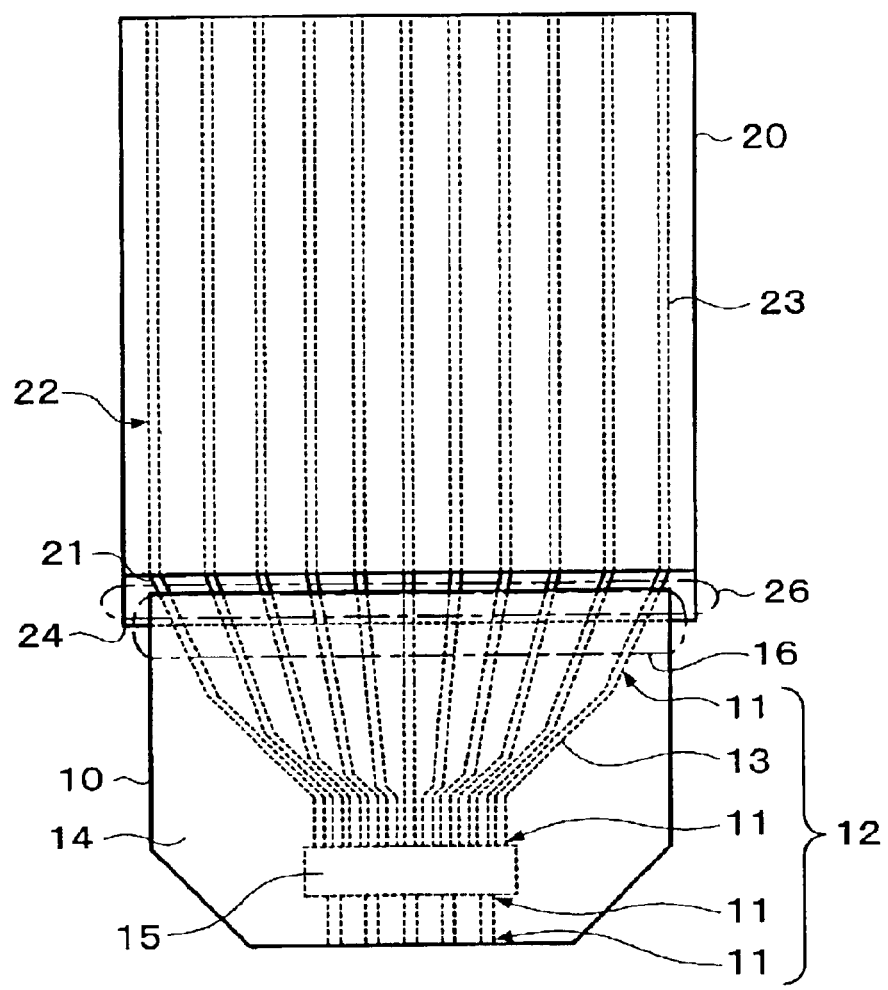
FIG. 1 is an illustrative view of an electronic device according to a first embodiment of the present invention.

The present invention is devised to solve prior problems, and may provide an electronic device, a method of manufacturing the same and a method of designing the same, and a circuit board and an electronic instrument, which assure reliable electrical conductions.

(1) An electronic device according to one embodiment of the present invention comprises a plurality of electronic components, wherein a first electronic component among the plurality of electronic components has a plurality of first terminals, wherein a second electronic component among the plurality of electronic components has a plurality of second terminals, wherein at least three terminals among the plurality of first terminals form a first group of terminals and at least three terminals among the plurality of second terminals form a second group of terminals, the first group of terminals and the second group of terminals being overlapped and electrically connected with one another, wherein each of the terminals in the first group is disposed on one of a plurality of first lines passing through a first point, wherein each of the terminals in the second group is disposed on one of a plurality of second lines passing through a second point, wherein the first and second points coincide with each other, and the first and second lines overlap, and wherein the terminals of at least one of the first and second groups are formed to extend along the first lines or the second lines.

According to the one embodiment of the present invention, each of the terminals of the first group and each of the terminals of the second group are disposed on any of the plurality of first lines or the plurality of second lines that coincide with one another. A member that supports the terminals of the first group or the second group expands or contracts, and the terminals move along the first lines or the second lines. In other words, the terminals of the first group and the terminals of the second group shift along the first lines or the second lines. However, since the terminals of the first and second groups are formed to extend along the first lines or the second lines, the electrical connection among the terminals of the first and second groups is secured.

(2) In the electronic device, each of the first and second electronic components may have an interconnecting pattern, and each of the first and second terminals may be a part of the interconnecting pattern.

(3) In the electronic device, each of the terminals in the first group may be formed to extend along one of the first lines, and each of the terminals in the second group may be formed to extend along one of the second lines.

(4) In the electronic device, a third electronic component among the plurality of electronic components may have a plurality of third terminals, and at least three terminals among the plurality of third terminals may form a third group of terminals and at least three terminals among the plurality of first terminals except the terminals in the first group may form a fourth group of terminals, the third group of terminals and the fourth group of terminals being overlapped and electrically connected with one another.

(5) In the electronic device, each of the terminals in the third group of the third electronic component may be formed to extend along one of a plurality of third lines passing through a third point, each of the terminals in the fourth group of the first electronic component may be formed to extend along one of a plurality of fourth lines passing through a fourth point, and the third and fourth points may coincide with each other and the third and fourth lines may overlap.

(6) In the electronic device, for the first electronic component, the first and fourth points may coincide with each other, and the first and fourth lines may overlap.

(7) In the electronic device, each of the plurality of electronic components may further include a chip component, the chip component may include a plurality of chip terminals, and at least three terminals among the plurality of first terminals except the terminals in the first group may form an A-group of terminals, and at least three terminals among the plurality of chip terminals may form a B-group of terminals, the A-group of terminals and the B-groups of terminals being overlapped and electrically connected with one another.

(8) In the electronic device, each of the terminals in the A-group may be formed to extend along one of a plurality of lines A passing through a point A, each of the terminals in the B-group may be disposed on one of a plurality of lines B passing through a point B, and the point A and the point B may coincide with each other, and the lines A and the lines B may overlap.

(9) In the electronic device, for the first electronic component, the first point and the point A may coincide with each other, and the first lines and the lines A may overlap.

(10) In the electronic device, for the first electronic component, the fourth point and the point A may coincide with each other, and the fourth lines and the lines A may overlap.

(11) In the electronic device, for the first electronic component, the first point, the fourth point and the point A may coincide with one another, and the first lines, the fourth lines and the lines A may overlap.

(12) In the electronic device, each of the terminals in the first group may be formed to extend along one of the plurality of first lines, the second electronic component may be a chip component, and at least three electrodes among a plurality of electrodes of the chip component may form the second group terminals.

(13) In the electronic device, the first electronic component may include an A-group of terminals formed of at least three terminals among the plurality of first terminals except the terminals in the first group, the second electronic component may include a B-group of terminals formed of at least three terminals among the plurality of second terminals except the terminals in the second group, the terminals in the A-group and the terminals in the B-group may be overlapped and electrically connected with one another, each of the terminals in the A-group may be formed to extend along one of a plurality of lines A passing through a point A, each of the terminals in the B-group may be disposed on one of a plurality of lines B passing through a point B, and the point A and the point B may coincide with each other, and the lines A and the lines B overlap.

(14) In the electronic device, for the first electronic component, the first point and the point A may coincide with each other, and the first lines and the lines A may overlap.

(15) In the electronic device, for the second electronic component, the second point and the point B may coincide with each other, and the second lines and the lines B may overlap.

(16) In the electronic device, for the first and second electronic components, the first point, the second point, the point A and the point B may coincide with one another, and the first lines, the second lines, the lines A and the lines B may overlap.

(17) In the electronic device, the plurality of first lines may be radially arranged passing through the first point, the plurality of second lines may be radially arranged passing through the second point, and each of the terminals in the first group may be formed to extend radially.

(18) In the electronic device, the first electronic component may include a flexible substrate, and the second electronic component may include an electro-optical panel.

(19) In the electronic device, the first electronic component may be an interposer, and the second electronic component may be a semiconductor chip.

(20) A circuit board according to another embodiment of the present invention includes the electronic device described above.

(21) An electronic instrument according to a further embodiment of the present invention includes the electronic device described above.

(22) A method of manufacturing an electronic device according to a still further embodiment of the present invention includes:

positioning and electrically connecting a first group of terminals and a second group of terminals, the first group of terminals being formed of at least three terminals among a plurality of first terminals of a first electronic component and the second group of terminals being formed of at least three terminals among a plurality of second terminals of a second electronic component;

disposing each of the terminals in the first group on one of a plurality of first lines passing through a first point; and disposing each of the terminals in the second group on one of a plurality of second lines passing through a second point, wherein an arrangement of the plurality of first lines is identical with an arrangement of the plurality of second lines, wherein the terminals of at least one of the first and second groups are formed to extend along the first lines or the second lines, and wherein positioning the terminals in the first and second groups is performed by causing the first lines to overlap with the second lines.

According to this embodiment of the present invention, each of the terminals of the first and second groups is disposed on any of the first or second lines. A member that supports the terminals of the first group or the second group expands or contracts, and the terminals move along the first lines or the second lines. In other words, the terminals of the first group and the terminals of the second group shift along the first lines or the second lines. However, the terminals of the first and second groups are formed to extend along the first lines or the second lines, and the first lines and the second lines have the same arrangement. Accordingly, by matching the first and second lines, at least a part of each of the terminals of the first group and at least a part of each of the terminals of the second group can be electrically connected to one another.

(23) The method of manufacturing an electronic device may comprise positioning the terminals in the first group and the terminals in the second group by causing the first and second points to coincide with each other and relatively rotating positions of the terminals in the first and second groups about the first and second points.

(24) The method of manufacturing an electronic device may comprise:

forming each of the terminals in the first group to extend along one of the first lines; and forming each of the terminals in the second group to extend along one of the second lines.

(25) The method of manufacturing an electronic device may further include positioning and electrically connecting a third group of terminals and a fourth group of terminals, the third group of terminals being formed of at least three terminals among a plurality of third terminals of a third electronic component and the fourth group of terminals being formed of at least three terminals among the plurality of first terminals except the terminals in the first group.

(26) The method of manufacturing an electronic device may comprise:

forming each of the terminals in the third group to extend along one of a plurality of third lines passing through a third point; and forming each of the terminals in the fourth group to extend along one of a plurality of fourth lines passing through a fourth point, and an arrangement of the plurality of third lines may be identical with an arrangement of the plurality of fourth lines, and the third and fourth points may coincide with each other and the third and fourth lines may overlap to thereby position the terminals in the third group and the terminals in the fourth group.

(27) In the method of manufacturing an electronic device, for the first electronic component, the first and fourth points may coincide with each other, and the first and fourth lines may overlap.

(28) The method of manufacturing an electronic device may further include positioning and electrically connecting an A-group of terminals and a B-group of terminals, the A-group of terminals being formed of at least three terminals among the plurality of first terminals except the terminals in the first group, and the B-group of terminals being formed of at least three terminals among a plurality of chip terminals of a chip component.

(29) The method of manufacturing an electronic device may comprise:

forming each of the terminals in the A-group to extend along one of a plurality of lines A passing through a point A; and disposing each of the terminals in the B-group on one of a plurality of lines B passing through a point B, and an arrangement of the plurality of lines A may be identical with an arrangement of the plurality of lines B, and positioning of the terminals in the A-group and the terminals in the B-group may be performed by causing the point A coincide with the point B and causing the lines A to overlap with the lines B.

(30) The method of manufacturing an electronic device may comprise forming each of the terminals in the first group to extend along one of the plurality of first lines, and the second electronic component may be a chip component, and at least three electrodes among a plurality of electrodes of the chip component may form the second group terminals.

(31) In the method of manufacturing an electronic device, the first electronic component may include an A-group of terminals formed of at least three terminals among the plurality of first terminals except the terminals in the first group, the second electronic component may include a B-group of terminals formed of at least three terminals among the plurality of second terminals except the terminals in the second group, the method may further comprise:

positioning and electrically connecting the terminals in the A-group and the terminals in the B-group with one another;

forming each of the terminals in the A-group to extend along one of a plurality of lines A passing through a point A; and disposing each of the terminals in the B-group on one of a plurality of lines B passing through a point B, an arrangement of the plurality of lines A may be identical with an arrangement of the plurality of lines B, and positioning of the terminals in the A-group and the terminals in the B-group may be performed by causing the lines A to overlap with lines B.

(32) The method of manufacturing an electronic device may comprise:

radially arranging the plurality of first lines passing through the first point;

radially arranging the plurality of second lines passing through the second point; and forming each of the terminals in the first group to extend radially.

(33) A method of designing an electronic device according to a yet further embodiment of the present invention includes:

designing a plurality of first terminals of a first electronic component and a plurality of second terminals of a second electronic component;

designing each of the terminals in a first group formed of at least three terminals among the plurality of first terminals to be disposed on one of a plurality of first lines passing through a first point; and designing each of the terminals in a second group formed of three of more terminals among the plurality of second terminals to be disposed on one of a plurality of second lines passing through a second point, and an arrangement of the plurality of first lines may be identical with an arrangement of the plurality of second lines, and the terminals in at least one of the first and second groups may be designed to extend along the first lines or the second lines.

(34) The method of designing an electronic device may comprise:

designing each of the terminals in the first group to extend along one of the plurality of first lines; and designing each of the terminals of the second group to extend along one of the plurality of second lines.

(35) The method of designing an electronic device may further include:

designing a plurality of third terminals of a third electronic component;

designing each of terminals in a third group formed of at least three terminals among the third terminals to extend along one of a plurality of third lines passing through a third point;

designing each of terminals in a fourth group formed of at least three terminals among the plurality of first terminals except the terminals in the first group to extend along one of a plurality of fourth lines passing through a fourth point; and designing the plurality of third lines and the plurality of fourth lines in the same arrangement.

(36) The method of designing an electronic device may comprise:

designing the first and fourth points for the first electronic component to coincide with each other; and designing the first and fourth lines to overlap.

(37) The method of designing an electronic device may further include:

designing a plurality of chip terminals of a chip component;

designing each of terminals in an A-group formed of at least three terminals among the plurality of first terminals except the terminals in the first group to extend along one of a plurality of lines A passing through a point A;

designing each of terminals in a B-group formed of at least three terminals among the plurality of chip terminals to extend along one of a plurality of lines B passing through a point B; and designing the plurality of lines A and the plurality of lines B in the same arrangement.

(38) The method of designing an electronic device may comprise:

designing the first point and the point A for the first electronic component to coincide with each other; and designing the first lines and the lines A to overlap.

(39) The method of designing an electronic device may comprise:

designing the fourth point and the point A for the first electronic component to coincide with each other; and designing the fourth lines and the lines A to overlap.

(40) The method of designing an electronic device may comprise:

designing the first point, the fourth point and the point A for the first electronic component to coincide with one another; and designing the first lines, the fourth lines and the lines A to overlap.

(41) The method of designing an electronic device may comprise designing each of the terminals in the first group to extend along one of the plurality of first lines, and the second electronic component may be a chip component, and at least three electrodes among a plurality of electrodes of the chip component may form the second group terminals.

(42) In the method of designing an electronic device, the first electronic component may include an A-group of terminals formed of at least three terminals among the plurality of first terminals except the terminals in the first group, the second electronic component may include a B-group of terminals formed of at least three terminals among the plurality of second terminals except the terminals in the second group, and the method may further comprise:

designing each of the terminals in the A-group to extend along one of a plurality of lines A passing through a point A;

designing each of the terminals in the B-group to be disposed on one of a plurality of lines B passing through a point B; and designing the plurality of lines A and the plurality of lines B in the same arrangement.

(43) The method of designing an electronic device may comprise:

designing the first point and the point A for the first electronic component to coincide with each other; and designing the first lines and the lines A to overlap.

(44) The method of designing an electronic device may comprise:

designing the plurality of first lines to be radially arranged passing through the first point;

designing the plurality of second lines to be radially arranged passing through the second point; and designing each of the terminals in the first group to be formed to extend radially.

Hereunder, preferred embodiments of the present invention will be described with reference to the accompanying drawings.

First Embodiment

FIGS. 1 and 2 are drawings to describe an electronic device according to a first embodiment of the present invention. The electronic device includes a plurality of electronic components (first and second electronic components 10 and 20).

The first electronic component 10 includes a plurality of first terminals 11. The first terminals 11 are used for electrical connections to other components. The first terminals 11 may be a part of an interconnecting pattern 12. The interconnecting pattern 12 includes a plurality of the first terminals 11, and interconnects 13 each of which electrically connects at least two of the first terminals 11. As shown in FIG. 1, the first terminals 11 can be formed at one ends of the interconnects 13. In a modified example, the first terminals 11 may be formed intermediate the interconnects 13.

The first terminals 11 (the interconnecting pattern 12) may be formed on a substrate 14. The first terminals 11, the interconnecting pattern 12 and the interconnects 13 are formed on one surface (a rear surface in FIG. 1) of the substrate 14. As shown in FIG. 1, ends of the first terminals 11 may coincide with a side end of the substrate 14. In a modified example, ends of the first terminals 14 may be located toward a center of the substrate 14 from its end side. Also, in a modified example, portions of the interconnecting pattern 12 other than the first terminals 11 may be supported by the substrate 14, and the first terminals 11 may protrude from the substrate 14. For example, the first terminals 11 may protrude from the end section of the substrate 14, or may protrude into a through hole (device hole) formed in the substrate 14. The substrate 14 may be a flexible substrate. The substrate 14 may be resin substrate.

The first electronic component 10 may include a chip component 15. The chip component 15 is electrically connected to any of the first terminals. The chip component 15 may be mounted on the substrate 15 by using a COF (Chip On Film) mounting method. TCP (Tape Carrier Package) may be applied to the first electronic component 10.

The second electronic component 20 includes a plurality of second terminals 21. The second terminals 21 are used for electrical connections to other components. The second terminals 21 may be a part of an interconnecting pattern 22. When the second electronic component 20 is an electro-optical panel (liquid crystal panel or the like), the interconnecting pattern 22 may include a plurality of the second terminals 21 and electrodes 23 for applying voltages (or supplying currents) to the electro-optical material (liquid crystal or the like). As shown in FIG. 1, the second terminals 21 may be formed at one ends of the electrodes 23. In a modified example, the second terminals 21 may be formed intermediate the electrodes 23.

The second terminals 21 (interconnecting pattern 22) may be formed on a substrate 24. The substrate 24 may be a glass substrate. A resin substrate has a greater thermal coefficient than that of a glass substrate. The contents described above for the first terminals 11 may be applicable to the second terminals 21.

A first group of terminals 16 and a second group of terminals 26 are electrically connected to one another. The first group of the terminals 16 is formed of at least three terminals among the first terminals 11. The second group of the terminals 26 is formed of at least three terminals among the second terminals 21. It is noted that, in the example of FIG. 1, the first electronic component 10 includes, besides the terminals 16 of the first group, at least one of the first terminals 11. In a modified example, all of the first terminals 11 may be the terminals 16 of the first group 1. In the example in FIG. 1, all of the second terminals 21 are the terminals 26 of the second group. In a modified example, the second electronic component 20 may include, besides the terminals 26 of the second group, at least one of the second terminals 21.

At least a part of each of the terminals 16 of the first group and at least a part of each of the terminals 26 of the second group are disposed to overlap. The terminals 16 and 26 of the first and second groups overlap and are electrically connected to one another. For the electrical connection, anisotropic conduction films or anisotropic conduction paste may be used, or metal junction may be applied, or pressure bonding with insulation adhesive may be applied.

Figure 2A:
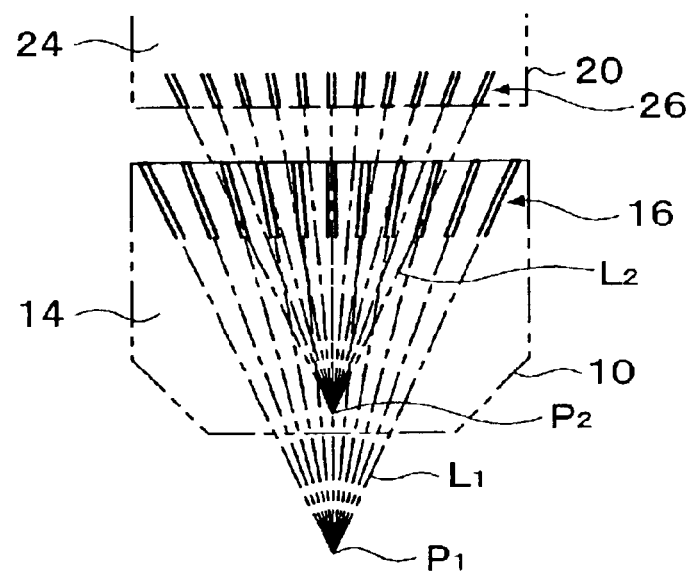
FIGS. 2A and 2B are illustrative views of the electronic device according to the first embodiment of the present invention.
Figure 2B:
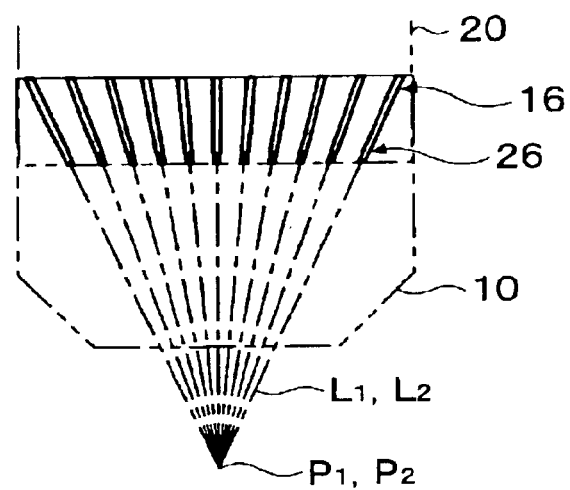

In the present embodiment, members (e.g., substrates 14 and 24) that support the terminals 16 and 26 of the first and second groups may expand or contract due to heat and humidity. FIGS. 2A and 2B show examples in which the substrate 14 expands, compared to the example shown in FIG. 1. It is noted that FIG. 2A is a drawing showing the terminals of the first and second groups before they are electrically connected to one another, and FIG. 2B is a drawing showing the terminals of the first and second groups after they are electrically connected to one another.

Each of the terminals 16 of the first group is disposed on one of a plurality of first lines $L_1$ passing through a first point $P_1$. Each of the terminals 26 of the second group is disposed on one of a plurality of second lines $L_2$ passing through a second point $P_2$. Here, an arrangement of the first lines $L_1$ and the second lines $L_2$ are identical to each other. In other words, the first lines $L_1$ and the second lines $L_2$ can overlap.

At least one of the first group of the terminals 16 and the second group of the terminals 26 is formed to extend along the first lines $L_1$ or the second lines $L_2$. In the present embodiment, each of the terminals 16 of the first group is formed to extend along one of the first lines $L_1$, and each of the terminals 26 of the second group is formed to extend along one of the second lines $L_2$. In a modified example, the details above may be applied to one of the first group of the terminals 16 and the second group of the terminals 26, which is supported by a member having a greater thermal coefficient. For example, when the substrate 14 on which the terminals 16 of the first group are formed is a resin substrate, and the substrate 24 on which the terminals 26 of the second group are formed is a glass substrate, only the terminals 16 of the first group can be formed to extend along the first lines $L_1$.

When the expansion or contraction of the members (substrates 14 and 24) that support the terminals 16 and 26 of the first and second groups takes place in the same rate in the lateral and longitudinal directions on planes on which the terminals 16 and 26 of the first and second groups are formed, the terminals 16 and 26 of the first and second groups move along the first lines $L_1$ or the second lines $L_2$. In other words, the terminals 16 and 26 of the first and second groups remain disposed on the first or second lines $L_1$ or $L_2$, when the members (substrates 14 and 24) that support these terminals expand or contract.

In the example shown in FIG. 2A, with the expansion of the substrate 14, the terminals 16 of the first group move along the first lines $L_1$ in a direction away from the first point $P_1$. Even in this case, as shown in FIG. 2B, when the first and second points $P_1$ and $P_2$ are coincide with one another, and the first and second lines $L_1$ and $L_2$ overlap, at least a part of the terminals 16 of the first group and at least a part of the terminals 26 of the second group overlap. It is noted, however, that portions of the terminals 16 of the first group close to the first point $P_1$ overlap the terminals 26 of the second group, compared to the case when the substrate 14 has no expansion. In this manner, even when the substrate 16 expands, the terminals 16 and 26 of the first and second groups can be electrically connected one another.

The explanation above pertains to an example in which the substrate 14 expands, and the same can be similarly applied to the case in which the substrate 24 expands. Furthermore, when the substrate 14 contracts, with the contraction of the substrate 14, the terminals 16 of the first group move along the first lines $L_1$ in a direction toward the first point $P_1$. Portions of the terminals 16 of the first group far from the first point $P_1$ overlap the terminals 26 of the second group, compared to the case when the substrate 14 has no contraction. This similarly applies to the case when the substrate 24 contracts.

In accordance with the present embodiment, each of the terminals 16 of the first group and each of the terminals 26 of the second group are disposed on one of the plurality of fist lines $L_1$ and one of the plurality of second lines $L_2$, respectively, that coincide with one another. When the member (substrate 14 or 26) that supports the terminals 16 or 26 of the first group or the second group expands or contracts, the terminals 16 or 26 move along the first lines $L_1$ or the second lines $L_2$. In other words, the terminals 16 of the first group and the terminals 26 of the second group shift along the first lines $L_1$ or the second lines $L_2$. However, as the terminals 16 of the first group or the terminals 26 of the second group are formed in a manner to extend along the first lines $L_1$ or the second lines $L_2$, the electrical connection between the terminals 16 and 26 of the first and second groups are secured.

Figure 3:
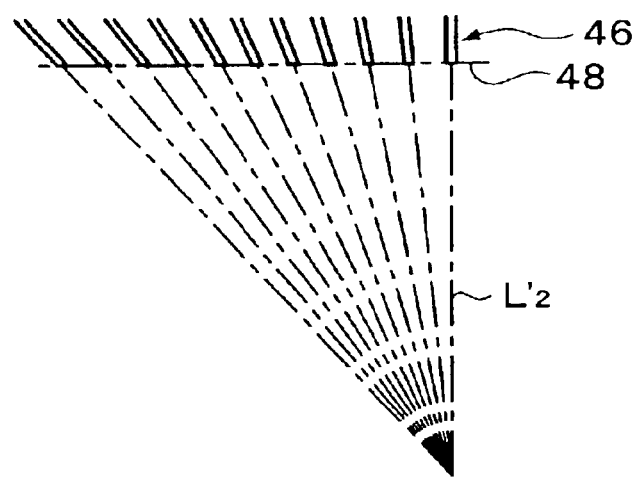
FIG. 3 is an illustrative view of a modified example of the electronic device according to the first embodiment of the present invention.
Figure 3:
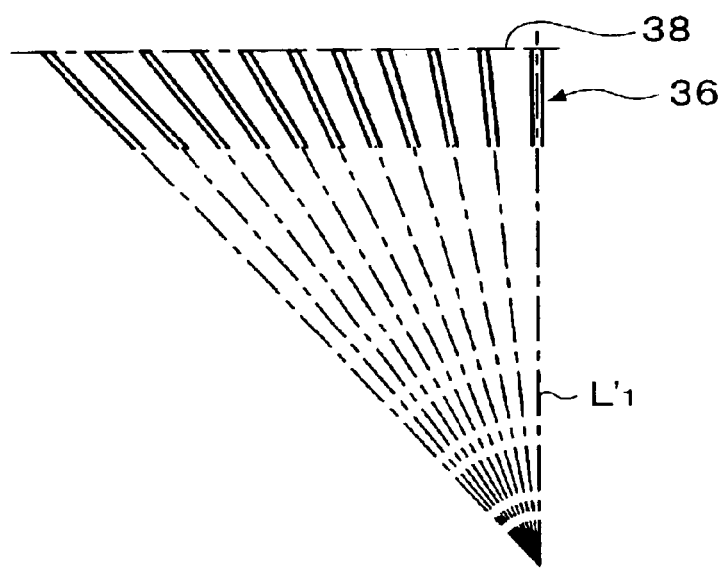

FIG. 3 shows a modified example of the embodiment described above. In the example shown in FIG. 1, right and left portions of the plural terminals 16 of the first group are symmetrically arranged. In this case, in FIG. 2 (A), when an imaginary line (not shown) that passes an intermediate point of two of the first lines $L_1$ that are located on the outermost sides and the first point $P_1$, ends of the terminals 16 of the first group are located along a line (not shown) perpendicular to the imaginary line. The same detail is similarly applied to the terminals 26 of the second group.

In the example shown in FIG. 3, right and left portions of a plurality of terminals 36 of a first group are asymmetrically arranged. In this case, ends of the terminals 36 of the first group are located along a line 38 that is perpendicular to one of first lines $L'_1$ (for example, one of the first lines $L'_1$ located on the outermost side). Also, ends of terminals 46 of a second group are located along a line 48 that is perpendicular to one of second lines $L'_2$ (for example, one of the second lines $L'_2$ located on the outermost side). These embodiments are also included in the present invention.

Figure 4:
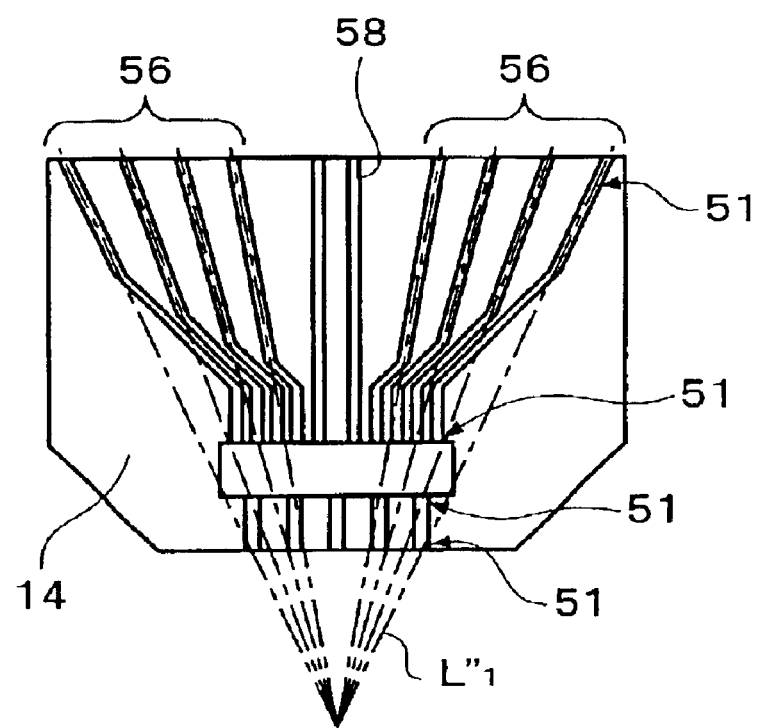
FIG. 4 is an illustrative view of a modified example of the electronic device according to the first embodiment of the present invention.

FIG. 4 shows a modified example of the embodiment described above. In the example shown in FIG. 1, all of the terminals that are arranged along one edge of the substrate 14 among the plurality of terminals 11 compose the terminals 16 of the first group. In the example shown in FIG. 4, among a plurality of first terminals 51, at least three (not all) of the terminals arranged along one edge of the substrate 14 compose a first group of terminals 56. Accordingly, at least one of the first terminals 51 arranged along one edge of the substrate 14 is not included in the first group of the terminals 56. For example, in FIG. 4, terminals 58 are not included in the first group of the terminals 56. In other words, the terminals 58 are not located on first lines $L''_1$. The terminals 58 are located along one edge of the substrate 14 in a central area thereof. Conversely, the terminals 56 in the first group are disposed along the one edge of the substrate 14 on both side portions of the one edge. Accordingly, the terminals 56 of the first group are formed at positions where the largest positional shifts take place due to expansion or contraction of the substrate 14.

Method of Manufacturing Electronic Device

Figure 5:
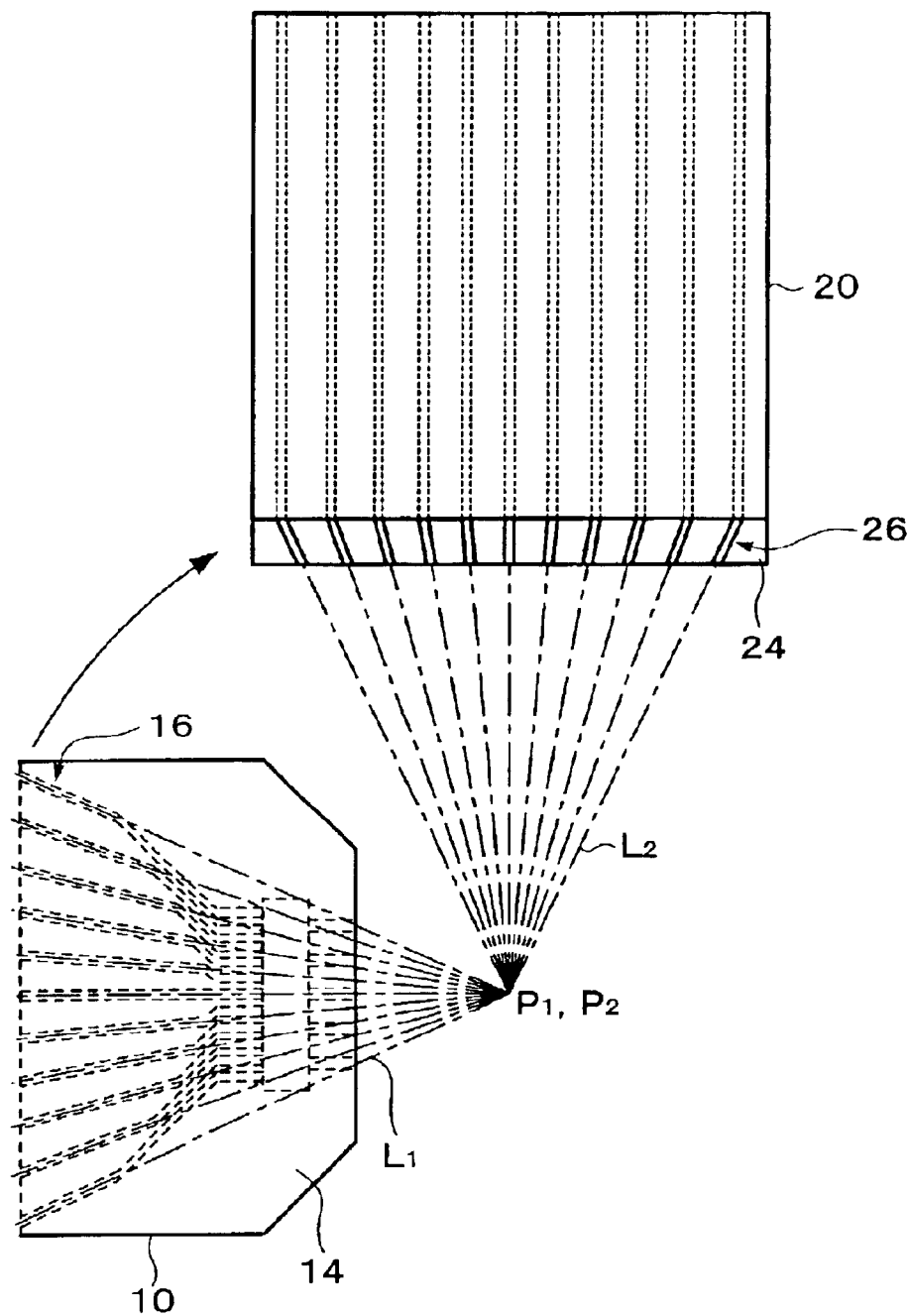
FIG. 5 is an illustrative view of a method of manufacturing the electronic device according to the first embodiment of the present invention.

FIG. 5 is a drawing showing a method of manufacturing an electronic device in accordance with a first embodiment of the present invention. The method of manufacturing an electronic device includes positioning the terminals 16 of the first group described above and the terminals 26 of the second group described above, and electrically connecting them. Here, the "positioning" means to dispose the first and second terminals 16 and 26 such that at least a part of each of the terminals 16 of the first group and at least a part of each of the terminals 26 of the second group overlap. The positioning can be done by bringing the first and second lines $L_1$ and $L_2$ in agreement. For example, the first and second points $P_1$ and $P_2$ are coincide with one another, and positions of the terminals 16 and 26 of the first and second groups are rotated relative to one another about the first and second points $P_1$ and $P_2$, respectively. Then, the first and second lines $L_1$ and $L_2$ overlap. More specifically, one of the terminals 16 of the first group overlaps with one of the terminals 26 of the second group.

According to the present embodiment, each of the terminals 16 and 26 of the first and second groups is disposed on one of the first and second lines $L_1$ and $L_2$. When the member (substrate 14 or 26) that supports the terminals 16 or 26 of the first group or the second group expands or contracts, the terminals 16 or 26 move along the first lines $L_1$ or the second lines $L_2$. In other words, the terminals 16 of the first group and the terminals 26 of the second group shift along the first lines $L_1$ or the second lines $L_2$. However, as the terminals 16 of the first group or the terminals 26 of the second group are formed in a manner to extend along the first lines $L_1$ or the second lines $L_2$, and the first and second lines $L_1$ and $L_2$ are arranged in the same manner. Therefore, by making the first and second lines $L_1$ and $L_2$ to overlap, at least a part of each of the terminals 16 of the first group and at least a part of each of the terminals 26 of the second group can be overlapped.

Then, the positioned terminals 16 and 26 of the first and second groups are electrically connected to one another. For the electrical connection, anisotropic conduction film or anisotropic conduction paste may be used, or metal junction may be applied, or pressure bonding with insulation adhesive may be applied.

Method of Designing Electronic Device

FIRST EXAMPLE

Figure 6A:
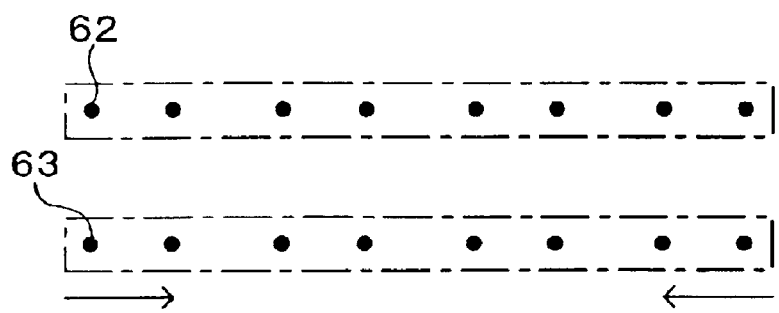
FIGS. 6A and 6B are illustrative views of a first example of a method of designing the electronic device according to the first embodiment of the present invention.
Figure 6B:
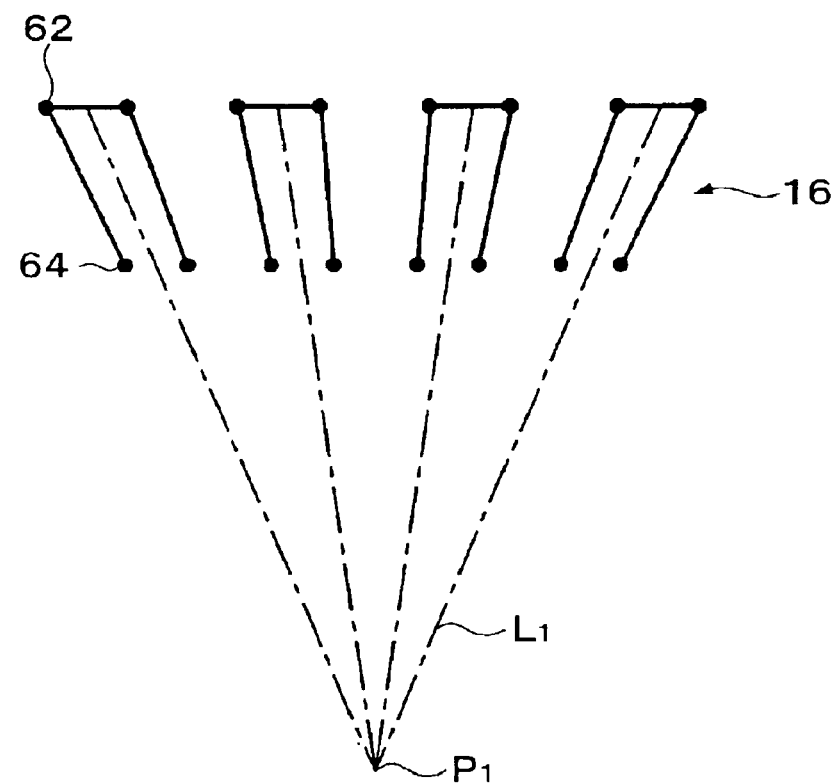

FIGS. 6A and 6B are drawings showing a method of designing an electronic device in accordance with an embodiment of the present invention. The method of designing an electronic device includes designing the first terminals 11 and the second terminals 12 described above. In particular, each of the terminals 16 of the first group is designed to be disposed on one of a plurality of lines $L_1$ passing through a first point $P_1$, and each of the terminals 26 of the second group is designed to be disposed on one of a plurality of lines $L_2$ passing through a first point $P_2$.

In the present embodiment, a plurality of points 62 that define locations of ends of the respective terminals 16 of the first group are plotted. Two adjacent points of among the points 62 determines a width of each of the terminals 16 of the first group. Also, one of the two points 62 that determines the width and an adjacent point 62 determines a gap between the terminals 16 of the first group.

Next, as shown in FIG. 6B, a plurality of points 64 that define positions except the end of each of the terminals 16 of the first group are plotted. More specifically, as shown in FIG. 6A, the plurality of points 62 described above are copied, and the copied points 63 are shifted vertically with respect to an arrangement direction of the points 62. Then, the points (multiple points) 63 are reduced in its arrangement direction, and a plurality of points 64 are plotted, as shown in FIG. 6B. Then, lines passing through the corresponding points 62, 62 are drawn to design the terminals 16 of the first group. In this case, the terminals 16 of the first group are disposed at equal pitches.

Each line that connects an intermediate point of the adjacent points 62 and an intermediate point of the adjacent points 64 defines a first line $L_1$. Each of the terminals 16 of the first group is disposed on one of the plurality of first lines $L_1$. As the distance in which the points 63 are shifted from the points 62 is long enough, the terminals 16 of the first group are designed to extend along the first lines $L_1$.

Similarly, the terminals 26 of the second group are designed. In this manner, the terminals 26 of the second group having the same arrangement as that of the terminals 16 of the first group can be designed. Also, the second lines $L_2$ have the same arrangement as that of the first lines $L_1$. The details described above in conjunction with the terminals 16 of the first group can be applied to the terminals 26 of the second group.

In accordance with the present embodiment, each of the terminals 16 and 26 of the first and second groups is designed to be disposed on one of the first and second lines $L_1$ and $L_2$. The terminals 16 or 26 of the first group or the second group thus designed, when the member (substrate 14 or 26) that supports these terminals expands or contracts, move along the first lines $L_1$ or the second lines $L_2$. In other words, the terminals 16 of the first group and the terminals 26 of the second group shift along the first lines $L_1$ or the second lines $L_2$. However, according to the present embodiment, the terminals 16 of the first group or the terminals 26 of the second group are designed in a manner to extend along the first lines $L_1$ or the second lines $L_2$. Accordingly, at least a part of each of the terminals 16 of the first group and at least a part of each of the terminals 26 of the second group can be electrically connected to one another.

SECOND EXAMPLE

Figure 7A:
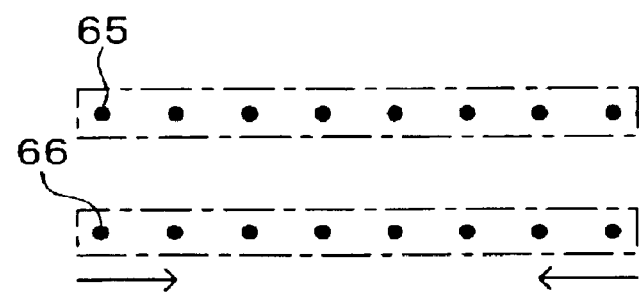
FIGS. 7A and 7B are illustrative views of a second example of a method of designing the electronic device according to the first embodiment of the present invention.
Figure 7B:
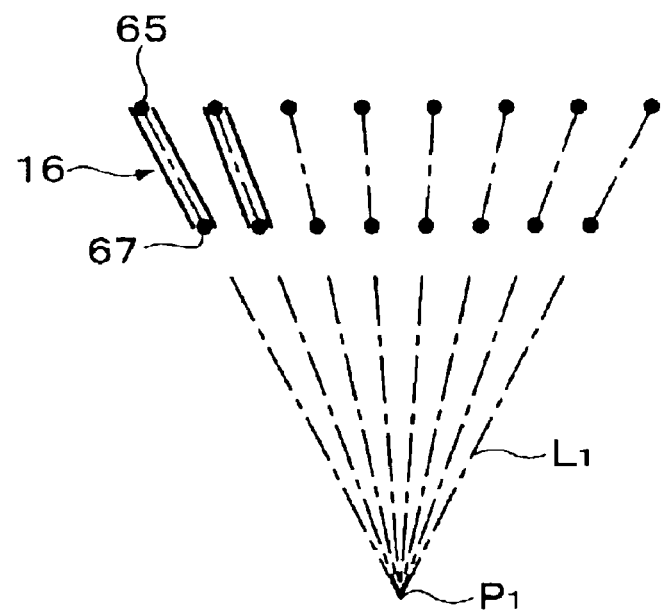

FIGS. 7A and 7B are drawings showing a method of designing an electronic device according to an embodiment of the present invention. In this example, a plurality of points 65 are plotted. Each of the points 65 is a point that passes each of the first lines $L_1$. Next, as shown in FIG. 7B, another plurality of points 67 are plotted. Each of the points 67 is a point that passes each of the first lines $L_1$. More specifically, as shown in FIG. 7A, the plurality of points 65 described above is copied, and the copied points 66 are shifted vertically with respect to a direction of their arrangement. Then, the points (multiple points) 65 are reduced in its arrangement direction, and a plurality of points 67 are plotted, as shown in FIG. 7B. Then, lines passing through the corresponding points 65 and 67 are drawn to design first lines $L_1$. Each of the terminals 16 can be designed along each of the first lines $L_1$. In this case also, the terminals 16 of the first group are disposed at equal pitches. As the distance in which the points 66 are shifted from the points 65 is long enough, the terminals 16 of the first group are designed to extend along the first lines $L_1$.

Similarly, the terminals 26 of the second group are designed. In this manner, the terminals 26 of the second group having the same arrangement as that of the terminals 16 of the first group can be designed. Also, the second lines $L_2$ have the same arrangement as that of the first lines $L_1$. The details described above in conjunction with the terminals 16 of the first group can be applied to the terminals 26 of the second group.

THIRD EXAMPLE

Figure 8:
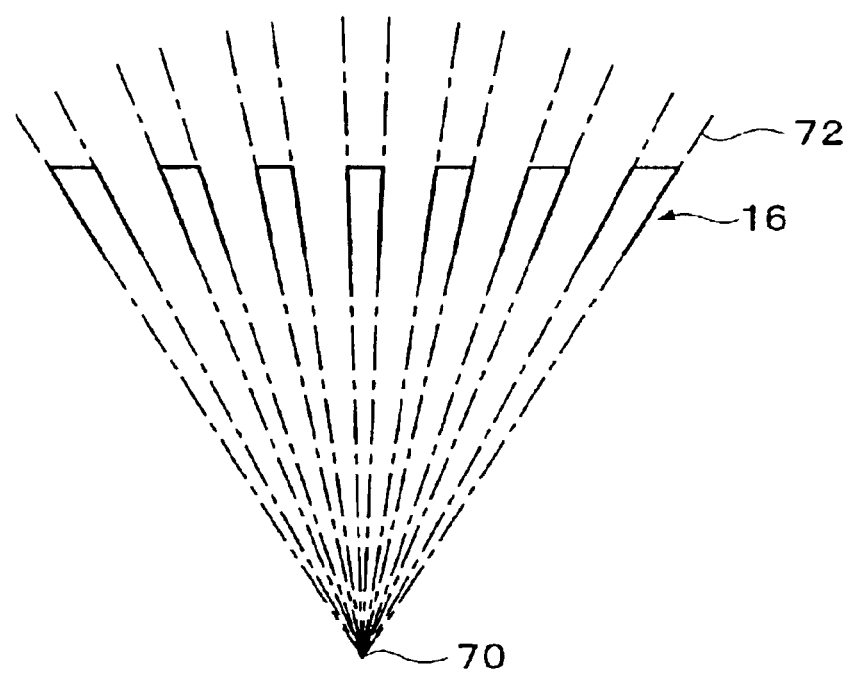
FIG. 8 is an illustrative view of a third example of a method of designing the electronic device according to the first embodiment of the present invention.

FIG. 8 is a drawing showing a method of designing an electronic device in accordance with an embodiment of the present invention. In this example, a plurality of lines 72 passing through a point 70 are drawn. Side edges of each of the terminal 16 of the first group are drawn on any of the lines 72 to design terminals 16 of the first group. In this case, each first line (not shown) passes between adjacent ones of the lines 72. Similarly, the terminals 26 of the second group are designed. In this manner, the terminals 26 of the second group having the same arrangement as that of the terminals 16 of the first group can be designed. Also, the second lines $L_2$ have the same arrangement as that of the first lines $L_1$. The details described above in conjunction with the terminals 16 of the first group can be applied to the terminals 26 of the second group.

FOURTH EXAMPLE

Figure 9:
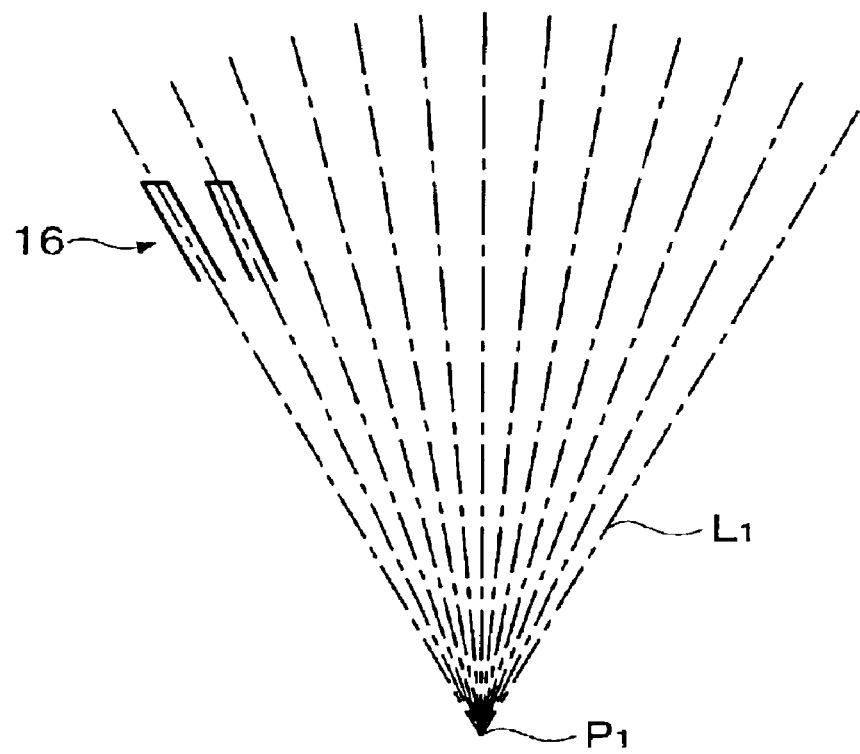
FIG. 9 is an illustrative view of a fourth example of a method of designing the electronic device according to the first embodiment of the present invention.

FIG. 9 is a drawing showing a method of designing an electronic device in accordance with an embodiment of the present invention. In this example, a plurality of first lines $L_1$ passing through a first point $P_1$ are drawn. Then, each of the terminals 16 of the first group is designed to be disposed on one of the first lines $L_1$. Similarly, the terminals 26 of the second group are designed. In this manner, the terminals 26 of the second group having the same arrangement as that of the terminals 16 of the first group can be designed. Also, the second lines $L_2$ have the same arrangement as that of the first lines $L_1$. The details described above in conjunction with the terminals 16 of the first group can be applied to the terminals 26 of the second group.

Second Embodiment

Figure 10:
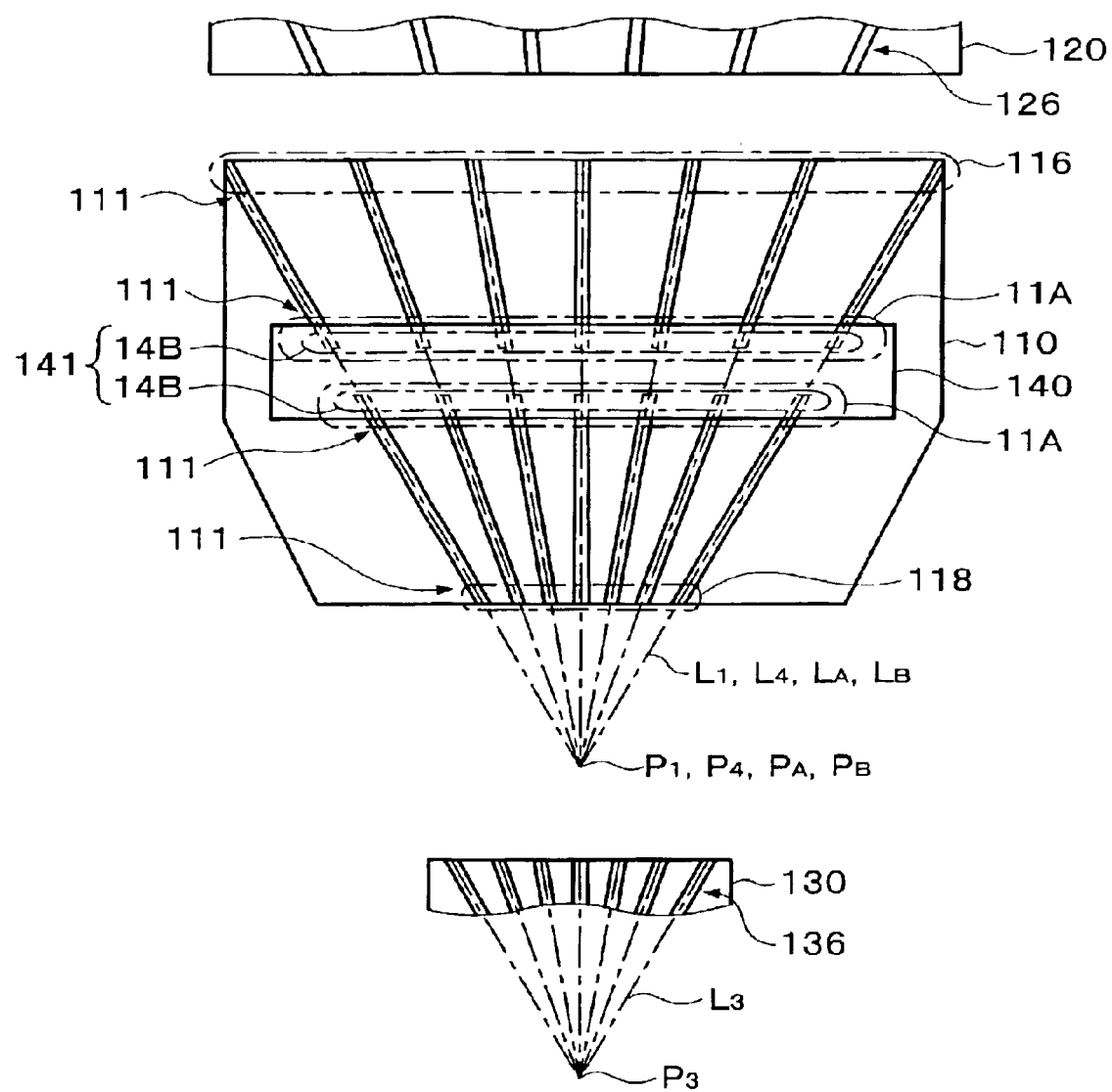
FIG. 10 is an illustrative view of an electronic device according to a second embodiment of the present invention.

FIG. 10 shows an exploded view of an electronic device according to a second embodiment of the present invention. The electronic device includes a plurality of electronic components (first, second and third electronic components 110, 120 and 130, and a chip component 140).

The first electronic component 110 includes a plurality of first terminals 111. At least three terminals among the plurality of first terminals 111 compose a first group of terminals 116. Each of the terminals 116 of the first group is disposed on one of a plurality of first lines $L_1$ passing through a first point $P_1$. For other details, the details described above in conjunction with the terminals 16 of the first group of the first embodiment are applicable to the terminals 116 of the first group.

Among the plurality of first terminals 111, at least three terminals except the terminals 116 of the first group (further except terminals 118 of a fourth group) compose an A-group of terminals 11A. The terminals 11A of the A-group are electrically connected to terminals 14B of a B-group of a chip component 140. For the electrical connection, the details of the electrical connection between the terminals 16 and 26 of the first and second groups described in the first embodiment can be applied. Each of the terminals 11A of the A-group is disposed on one of a plurality of A-lines $L_A$ passing through an A-point $P_A$. In the present embodiment, the first point $P_1$ and the A-point $P_A$ coincide with one another and the first lines $L_1$ and the A-lines $L_A$ overlap. For other details, the contents described in the first embodiment for the terminals 16 of the first group may be applied to the terminals 11A of the A-group.

In the present embodiment, the terminals 11A of the A-groups are formed at a plurality of locations. The terminals 11A of the first A-group (the upper side in FIG. 10) and the terminals 11A of the second A-group (the lower side in FIG. 10) are disposed separated from one another. Also, the terminals 11A of the first and second A-groups both extend along the A-lines $L_A$. More specifically, each of the terminals 11A of the second A-group is disposed at a distance along each of the A-lines $L_A$ separated from each of the corresponding terminals 11A of the first A-group.

Among the first terminals 111, at least three terminals except the terminals 116 of the first group (further except the terminals 11A of the A-group) compose a fourth group of terminals 118. The terminals 118 of the fourth group are electrically connected to terminals 136 of a third group to be described later. For the electrical connection, the details of the electrical connection between the terminals 16 and 26 of the first and second groups described in the first embodiment can be applied. Each of the terminals 118 of the fourth group is disposed on one of a plurality of fourth lines $L_4$ passing through a fourth point $P_4$. In the present embodiment, the first and fourth points $P_1$ and $P_4$ coincide with one another, and the first and fourth lines $L_1$ and $L_4$ overlap. Also, the fourth point $P_4$ and the A-point $P_A$ coincide with one another, and the fourth lines $L_4$ and the A-lines $L_A$ overlap. For other details, the contents described in the first embodiment for the terminals 16 of the first group may be applied to the terminals 118 of the fourth group.

The details described in the first embodiment for the second electronic component 20 are applicable to the second electronic component 120, which includes a second group of terminals 126. The terminals 116 and 126 of the first and second groups are electrically connected to one another. More specific details described in the first embodiment are also applicable.

The third electronic component 130 includes a plurality of third terminals. At least three terminals among the third terminals compose a third group of terminals 136. Each of the terminals 136 of the third group is disposed on one of a plurality of third lines $L_3$ passing through a third point $P_3$. For other details, the contents described in conjunction with the first electronic component 10 or the second electronic component 20 in the first embodiment may be applicable to the third electronic component 130.

In the present embodiment, the terminals 136 and 118 of the third and fourth groups are electrically connected to one another. For the electrical connection, the details of the electrical connection between the terminals 16 and 26 of the first and second groups described in the first embodiment can be applied. Positions of the terminals 136 and 118 of the third and fourth groups can be overlapped by making the third and fourth points $P_3$ and $P_4$ coincide with each other, and making the third and fourth lines $L_3$ and $L_4$ overlap.

The chip component 140 is for example a semiconductor chip. The chip component 140 includes a plurality of chip terminals 141. At least three terminals among the plurality of chip terminals 141 compose a B-group of terminals 14B.

In the present embodiment, the terminals 14 of the B-groups are formed at multiple locations. The terminals 14B of the first B-group (the upper side in FIG. 10) and the terminals 14B of the second B-group (the lower side in FIG. 10) are disposed separated from one another. Also, the terminals 14B of the first and second B-groups both extend along the B-lines $L_B$. More specifically, each of the terminals 14B of the second B-group is disposed at a distance along each of the B-lines $L_B$ separated from each of the corresponding terminals 14B of the first B-group.

The terminals 14B of the B-group and the terminals 11A of the A-group described above are electrically connected to one another. For the electrical connection, the details of the electrical connection between the terminals 16 and 26 of the first and second groups described in the first embodiment can be applied. Each of the terminals 14B of the B-group is disposed on one of a plurality of B-lines $L_B$ passing through a B-point $P_B$. In the present embodiment, positions of the terminals 11A and 14B of the A-group and B-group can be overlapped by making the A-point $P_A$ and B-point $P_B$ coincide with each other, and making the A-lines $L_A$ and B-lines $L_B$ overlap. For other details, the contents described in the first embodiment for the terminals 16 of the first group may be applied to the terminals 14B of the B-group.

Method of Manufacturing Electronic Device

In a method of manufacturing an electronic device in accordance with the present embodiment, positions of the terminals 136 and 118 of the third and fourth overlap by making the third and fourth points $P_3$ and $P_4$ coincide with each other, and making the third and fourth lines $L_3$ and $L_4$ overlap. It is noted that the arrangement of the plurality of third lines $L_3$ is the same as the arrangement of the plurality of fourth lines $L_4$. Also, positions of the terminals 11A and 14B of the A-group and B-group can be overlapped by making the A-point $P_A$ and B-point $P_B$ coincide with each other, and making the A-lines $L_A$ and B-lines $L_B$ overlap. It is noted that the arrangement of the plurality of A-lines $L_A$ is the same as the arrangement of the plurality of B-lines $L_B$. For other details, the details of the method of manufacturing an electronic device described in the first embodiment can be applied to the present embodiment.

Method of Designing Electronic Device

In the method of designing an electronic device in accordance with the present embodiment, the plurality of third terminals of the third electronic component 130 are designed. In particular, each of the terminals 136 of the third group is designed to extend along one of the plurality of third lines $L_3$ passing through the third point $P_3$. Also, each of the terminals 118 of the fourth group is designed to extend along one of the plurality of fourth lines $L_4$ passing through the fourth point $P_4$. It is noted that the plurality of third lines $L_3$ and the plurality of fourth lines $L_4$ are designed to have the same arrangement. For other details, the details of the method of designing the terminals 16 of the first group described in the first embodiment can be applied.

In the present embodiment, the plurality of chip terminals of the chip component 140 are designed. In this case, each the terminals 11A of the A-group is designed to extend along one of the plurality of A-lines $L_A$ passing through the A-point $P_A$. Also, each of the terminals 14B of the B-group, which are formed from at least three terminals among the plurality of chip terminals, is designed to be disposed on one of the plurality of B-lines $L_B$ passing through the B-point $P_B$. Further, the plurality of A-lines $L_A$ and the plurality of B-lines $L_B$ are designed to have the same arrangement.

In the present embodiment, the first and fourth points $P_1$ and $P_4$ are designed to coincide with one another, and the first and fourth lines $L_1$ and $L_4$ are designed to overlap. The first point $P_1$ and the A-point $P_A$ are designed to coincide with one another. The first lines $L_1$ and the A-lines $L_A$ are designed to overlap. The fourth point $P_4$ and the A-point $P_A$ are designed to coincide with one another. The fourth lines $L_4$ and the A-lines $L_A$ are designed to overlap. The first point $P_1$, the fourth point $P_4$ and the A-point $P_A$ are designed to coincide with one another. The first lines $L_1$, the fourth lines $L_4$ and the A-lines $L_A$ are designed to overlap. For other details, the details of the method of designing an electronic device described in the first embodiment can be applied to the present embodiment.

Third Embodiment

Figure 11:
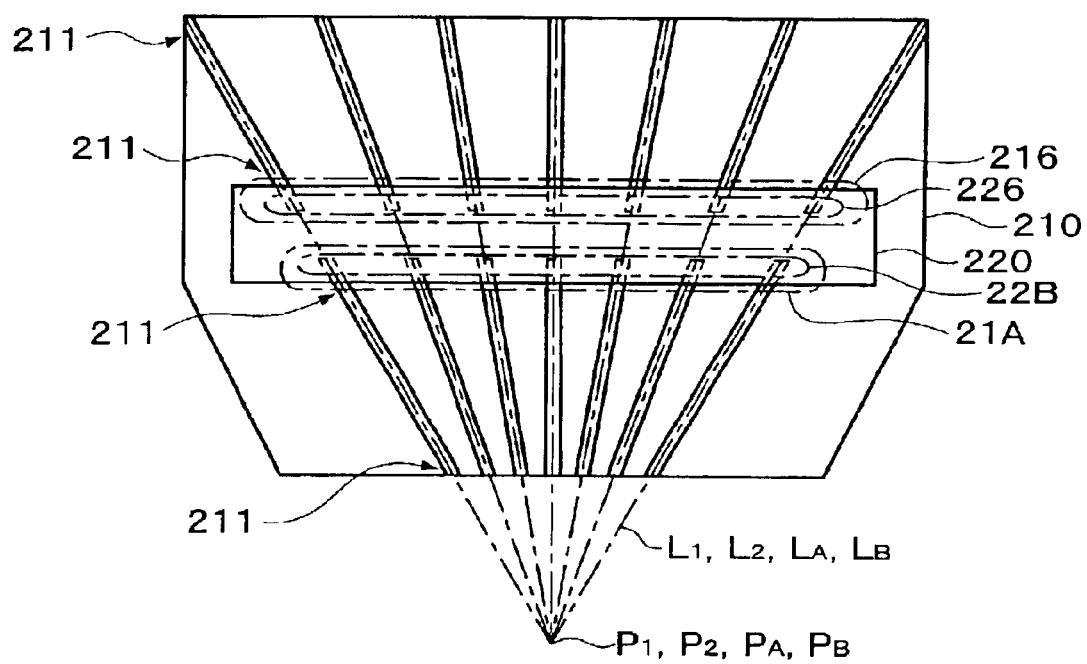
FIG. 11 is an illustrative view of an electronic device according to a third embodiment of the present invention.

FIG. 11 is a drawing to describe an electronic device according to a third embodiment of the present invention. The electronic device includes a plurality of electronic components (first and second electronic components 210 and 220). The second electronic component 210 is a chip component (for example, a semiconductor chip). The second electronic component 220 is mounted on the first electronic component 210. The second electronic component 220 may be mounted on the first electronic component 210 by using a COF (Chip On Film) mounting method. TCP (Tape Carrier Package) may be applied to the electronic device.

The first electronic component 210 includes a plurality of first terminals 211. At least three terminals among the plurality of first terminals 211 compose a first group of terminals 216. Each of the terminals 216 of the first group is disposed on one of a plurality of first lines $L_1$ passing through a first point $P_1$. For other details, the details of the terminals 16 of the first group described above in conjunction with the first embodiment are applied to the terminals 216 of the first group.

Among the plurality of first terminals 211, at least three terminals except the terminals 216 of the first group compose an A-group of terminals 21A. The terminals 21A of the A-group are electrically connected to terminals 22B of a B-group of the second electronic component 220. For the electrical connection, the details of the electrical connection between the terminals 16 and 26 of the first and second groups described in the first embodiment can be applied. Each of the terminals 21A of the A-group is disposed on one of a plurality of A-lines $L_A$ passing through an A-point $P_A$. In the present embodiment, the first point $P_1$ and the A-point $P_A$ coincide with one another, and the first lines $L_1$ and the A-lines $L_A$ overlap. For other details, the contents of the terminals 16 of the first group described in the first embodiment may be applied to the terminals 21A of the A-group.

The second electronic component 220 includes a plurality of second terminals. At least three terminals among the plurality of second terminals compose a second group of terminals 226. The terminals 226 of the second group may be any of electrodes, pads or bumps. Each of the terminals 226 of the second group is disposed on one of a plurality of second lines $L_2$ passing through a second point $P_2$.

Among the plurality of second terminals, at least three terminals except the terminals 226 of the second group compose a B-group of terminals 22B. The terminals 22B of the B-group are electrically connected to the terminals 21A of the A-group of the first electronic component 210. For the electrical connection, the details of the electrical connection between the terminals 16 and 26 of the first and second groups described in the first embodiment can be applied. Each of the terminals 22B of the B-group is disposed on one of a plurality of B-lines $L_B$ passing through a B-point $P_B$ In the present embodiment, the second point $P_2$ and the B-point $P_B$ coincide with one another, and the second lines $L_2$ and the B-lines $L_B$ overlap.

In the present embodiment, positions of the terminals 21A and 22B of the A-group and B-group overlap by making the A-point $P_A$ and B-point $P_B$ coincide with each other, and making the A-lines $L_A$ and B-lines $L_B$ overlap. It is noted that the first point $P_1$, the second point $P_2$, the A-point $P_A$ and the B-point $P_B$ coincide with one another, and the first lines $L_1$, the second lines $L_2$, the A-lines $L_A$, and the B-lines $L_B$ overlap. The present embodiment provides the effects described in the first embodiment. The details of any of the embodiments described above can be applied to the present embodiment.

Method of Manufacturing Electronic Device

The details described in the first embodiment are applied to the method of manufacturing an electronic device in accordance with the present embodiment. Also, in the method of manufacturing an electronic device in accordance with the present embodiment, the terminals 21A and 22B of the A-group and B-group are positioned and electrically connected to one another. It is noted that the arrangement of the plurality of A-lines $L_A$ and the arrangement of the plurality of B-lines $L_B$ are identical with one another. Positions of the terminals 21A and 22B of the A-group and B-group are overlapped by making the A-lines $L_A$ and B-lines $L_B$ overlap.

Method of Designing Electronic Device

The details described in the first embodiment are applied to the method of designing an electronic device according to the present embodiment. Also, in the method of designing an electronic device according to the present embodiment, each of the terminals 21A of the A-group is designed to extend along one of the plurality of A-lines $L_A$ passing through the A-point $P_A$. Each of the terminals 21B of the B-group is designed to extend along one of the plurality of B-lines $L_B$ passing through the B-point $P_B$. The plurality of A-lines $L_A$ and the plurality of B-lines $L_B$ are designed to have the same arrangement. The first point $P_1$ and the A-point $P_A$ are designed to coincide with one another. The first lines $L_1$ and the A-lines $L_A$ are designed to overlap.

Fourth Embodiment

Figure 12:
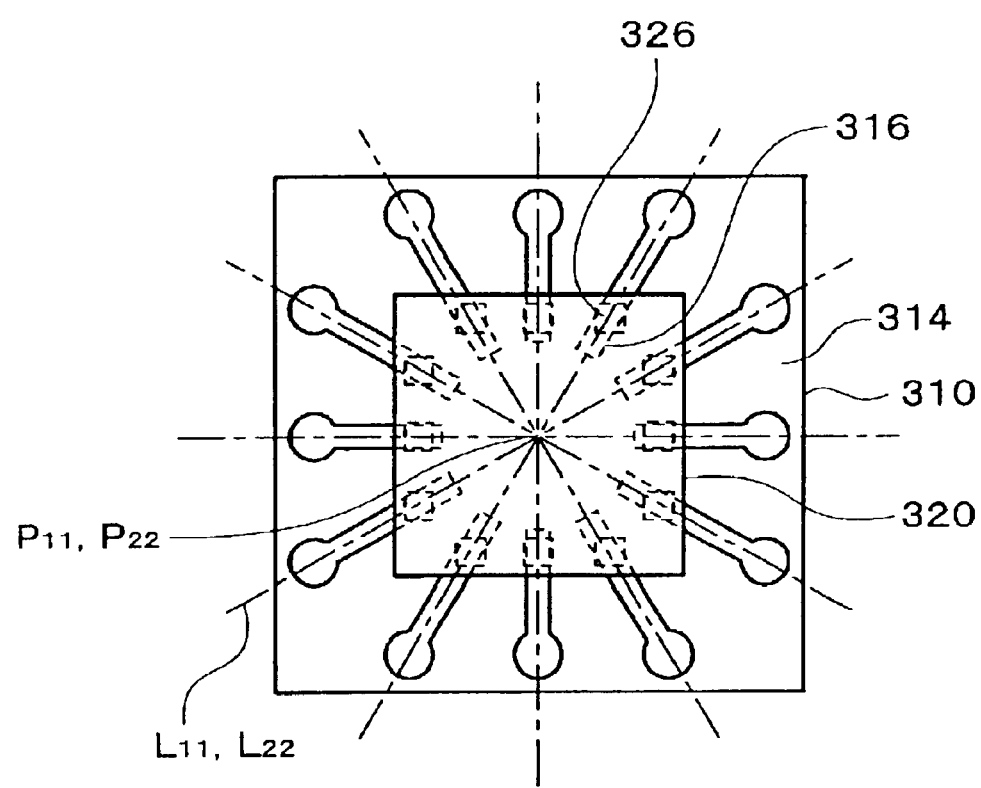
FIG. 12 is an illustrative view of an electronic device according to a fourth embodiment of the present invention.

FIG. 12 is a drawing to describe an electronic device according to a fourth embodiment of the present invention. The electronic device includes a plurality of electronic components (first and second electronic components 310 and 320). The electronic device in the present embodiment is a semiconductor device.

The first electronic component 310 includes, a first group of terminals 316. Details thereof are the same as those described in the first embodiment. The terminals 316 of the first group are connected to an interposer 314. For other details, the details of the first electronic component 10 described in the first embodiment are applied to the first electronic component 310.

The second electronic component 320 is a chip component (semiconductor chip). The second electronic component 320 includes a second group of terminals 326. Each of the terminals 326 of the second group may be any one of electrodes, pads or bumps. The second electronic component 320 is mounted on the first electronic component 310. The terminals 316 and 326 of the first and second groups are electrically connected to one another. For the electrical connection, the details of the electrical connection between the terminals 16 and 26 of the first and second groups described in the first embodiment can be applied.

Each of the terminals 316 of the first group is disposed on one of a plurality of first lines $L_{11}$ passing through a first point $P_{11}$. Each of the terminals 326 of the second group is disposed on one of a plurality of second lines $L_{22}$ passing through a second point $P_{22}$. The plurality of first lines $L_{11}$ pass the first point $P_{11}$, and radially arranged. The plurality of second lines $L_{22}$ pass the second point $P_{22}$, and radially arranged. Each of the terminals 316 of the first group is formed to extend radially. For other details of the present embodiment, the details of any of the embodiments described above can be applied.

Figure 13:
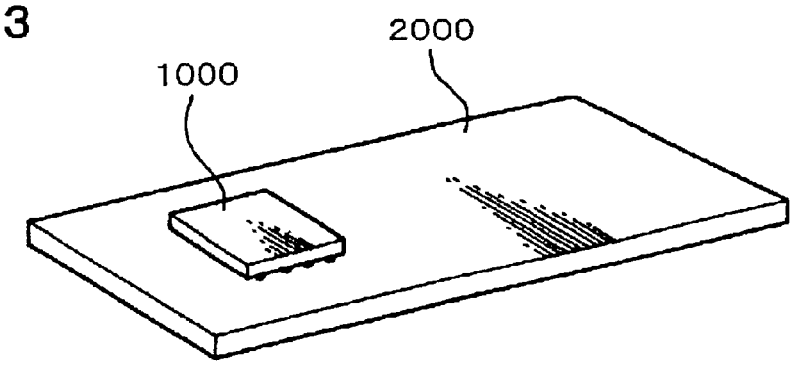
FIG. 13 shows a circuit board according to an embodiment of the present invention.
Figure 14:
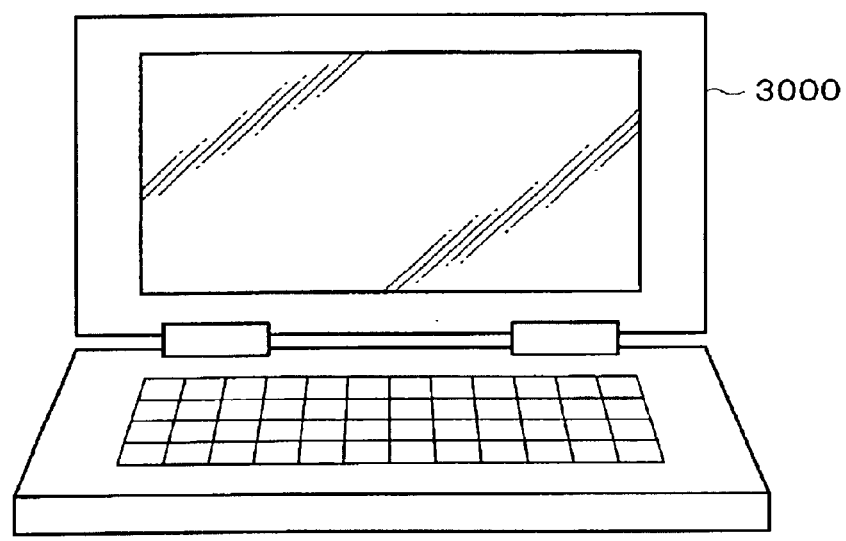
FIG. 14 shows a drawing of an electronic instrument according to an embodiment of the present invention.
Figure 15:
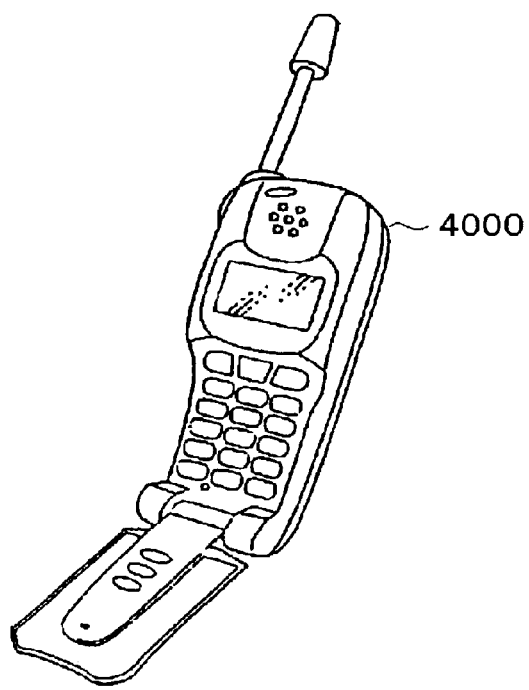
FIG. 15 shows an electronic instrument according to an embodiment of the present invention.

FIG. 13 shows a circuit board 2000 on which an electronic device (semiconductor device) 1000 shown in FIG. 12 is mounted. As electronic instruments in accordance with embodiments of the present invention, FIG. 14 shows a notebook type personal computer 3000, and FIG. 15 shows a mobile telephone 4000.

The present invention is not limited to the embodiments described above, and many modification can be made. For example, the present invention includes compositions that are substantially the same as the compositions described in the embodiments (for example, a composition that has the same functions, the same methods and the results, or a composition that have the same objects and results). Also, the present invention includes compositions in which portions not essential in the compositions described in the embodiments are replaced with others. Also, the present invention includes compositions that achieve the same functions and effects or achieve the same objects of those of the compositions described in the embodiments. Furthermore, the present invention includes compositions that include publicly known technology added to the compositions described in the embodiments.

What is claimed is:

1. An electronic device comprising a plurality of electronic components,
   wherein a first electronic component among the plurality of electronic components has a plurality of first terminals,
   wherein a second electronic component among the plurality of electronic components has a plurality of second terminals,
   wherein at least three terminals among the plurality of first terminals form a first group of terminals and at least three terminals among the plurality of second terminals form a second group of terminals, the first group of terminals and the second group of terminals being overlapped and electrically connected with one another,
   wherein each of the terminals in the first group is disposed on one of a plurality of first lines passing through a first point,
   wherein each of the terminals in the second group is disposed on one of a plurality of second lines passing through a second point,
   wherein the first and second points coincide with each other, and the first and second lines overlap,
   wherein the terminals of at least one of the first and second groups are formed to extend along the first lines or the second lines,
   wherein ends of the terminals in the first group are arranged in a first position that forms a straight line, and
   wherein ends of the terminals in the second group are arranged in a second position that forms a straight line.

2. The electronic device as defined by claim 1,
   wherein each of the first and second electronic components has an interconnecting pattern, and
   wherein each of the first and second terminals is a part of the interconnecting pattern.

3. The electronic device as defined by claim 1,
   wherein each of the terminals in the first group is formed to extend along one of the first lines, and
   wherein each of the terminals in the second group is formed to extend along one of the second lines.

4. The electronic device as defined by claim 1,
   wherein the first electronic component includes a flexible substrate, and
   wherein the second electronic component includes an electro-optical panel.

5. An electronic instrument comprising the electronic device as defined by claim 1.

6. An electronic device comprising a plurality of electronic components,
   wherein a first electronic component among the plurality of electronic components has a plurality of first terminals, wherein a second electronic component among the plurality of electronic components has a plurality of second terminals, wherein at least three terminals among the plurality of first terminals form a first group of terminals and at least three terminals among the plurality of second terminals form a second group of terminals, the first group of terminals and the second group of terminals being overlapped and electrically connected with one another, wherein each of the terminals in the first group is disposed on one of a plurality of first lines passing through a first point, wherein each of the terminals in the first group is formed to extend alone one of the first lines, wherein each of the terminals in the second group is disposed on one of a plurality of second lines passing through a second point, wherein each of the terminals in the second group is formed to extend along one of the second lines, wherein the first and second points coincide with each other, and the first and second lines overlap, wherein a third electronic component among the plurality of electronic components has a plurality of third terminals, and wherein at least three terminals among the plurality of third terminals form a third group of terminals and at least three terminals among the plurality of first terminals except the terminals in the first group form a fourth group of terminals, the third group of terminals and the fourth group of terminals being overlapped and electrically connected with one another.

7. The electronic device as defined by claim 6, wherein the first electronic component includes a flexible substrate, and wherein the second electronic component includes an electro-optical panel.

8. An electronic instrument comprising the electronic device as defined by claim 6.

9. The electronic device as defined by claim 6, wherein each of the terminals in the third group of the third electronic component is formed to extend along one of a plurality of third lines passing through a third point, wherein each of the terminals in the fourth group of the first electronic component is formed to extend along one of a plurality of fourth lines passing through a fourth point, and wherein the third and fourth points coincide with each other and the third and fourth lines overlap.

10. The electronic device as defined by claim 9, wherein for the first electronic component, the first and fourth points coincide with each other, and the first and fourth lines overlap.

11. The electronic device as defined by claim 9, wherein each of the plurality of electronic components further includes a chip component, wherein the chip component includes a plurality of chip terminals, and wherein at least three terminals among the plurality of first terminals except the terminals in the first group form an A-group of terminals, and at least three terminals among the plurality of chip terminals form a B-group of terminals, the A-group of terminals and the B-groups of terminals being overlapped and electrically connected with one another.

12. The electronic device as defined by claim 11, wherein each of the terminals in the A-group is formed to extend along one of a plurality of lines A passing through a point A, wherein each of the terminals in the B-group is disposed on one of a plurality of lines B passing through a point B, and wherein the point A and the point B coincide with each other, and the lines A and the lines B overlap.

13. The electronic device as defined by claim 12, wherein for the first electronic component, the first point and the point A coincide with each other, and the first lines and the lines A overlap.

14. The electronic device as defined by claim 12, wherein for the first electronic component, the fourth point and the point A coincide with each other, and the fourth lines and the lines A overlap.

15. The electronic device as defined by claim 12, wherein for the first electronic component, the first point, the fourth point and the point A coincide with one another, and the first lines and the fourth lines and the lines A overlap.

16. An electronic device comprising a plurality of electronic components, wherein a first electronic component among the plurality of electronic components has a plurality of first terminals, wherein a second electronic component among the plurality of electronic components has a plurality of second terminals, wherein at least three terminals among the plurality of first terminals form a first group of terminals and at least three terminals among the plurality of second terminals form a second group of terminals, the first group of terminals and the second group of terminals being overlapped and electrically connected with one another, wherein each of the terminals in the first group is disposed on one of a plurality of first lines passing through a first point, wherein each of the terminals in the second group is disposed on one of a plurality of second lines passing through a second point, wherein the first and second points coincide with each other, and the first and second lines overlap, wherein each of the terminals in the first group is formed to extend along one of the plurality of first lines, wherein the second electronic component is a chip component, and wherein at least three electrodes among a plurality of electrodes of the chip component form the second group terminals.

17. The electronic device as defined by claim 16, wherein the plurality of first lines are radially arranged passing through the first point, wherein the plurality of second lines are radially arranged passing through the second point, and wherein each of the terminals in the first group is formed to extend radially.

18. An electronic instrument comprising the electronic device as defined by claim 16.

19. The electronic device as defined by claim 16,
wherein the first electronic component includes an A-group of terminals formed of at least three terminals among the plurality of first terminals except the terminals in the first group,
wherein the second electronic component includes a B-group of terminals formed of at least three terminals among the plurality of second terminals except the terminals in the second group,
wherein the terminals in the A-group and the terminals in the B-group are overlapped and electrically connected with one another,
wherein each of the terminals in the A-group is formed to extend along one of a plurality of lines A passing through a point A,
wherein each of the terminals in the B-group is disposed on one of a plurality of lines B passing through a point B, and
wherein the point A and the point B coincide with each other, and the lines A and the lines B overlap.

20. The electronic device as defined by claim 19,
wherein for the first electronic component, the first point and the point A coincide with each other, and the first lines and the lines A overlap.

21. The electronic device as defined by claim 19,
wherein for the second electronic component, the second point and the point B coincide with each other, and the second lines and the lines B overlap.

22. The electronic device as defined by claim 19,
wherein for the first and second electronic components, the first point, the second point, the point A and the point B coincide with one another, and the first lines, the second lines, the lines A and the lines B overlap.

23. The electronic device as defined by claim 16, formed as a semiconductor device,
wherein the first electronic component is an interposer, and
wherein the second electronic component is a semiconductor chip.

24. A circuit board comprising the electronic device as defined by claim 23.

25. A method of manufacturing an electronic device, comprising:
positioning and electrically connecting a first group of terminals and a second group of terminals, the first group of terminals being formed of at least three terminals among a plurality of first terminals of a first electronic component and the second group of terminals being formed of at least three terminals among a plurality of second terminals of a second electronic component;
disposing each of the terminals in the first group on one of a plurality of first lines passing through a first point so that ends of the terminals in the first group are arranged in a first position that forms a straight line; and
disposing each of the terminals in the second group on one of a plurality of second lines passing through a second point so that ends of the terminals in the second group are arranged in a second position that forms a straight line,
wherein an arrangement of the plurality of first lines is identical with an arrangement of the plurality of second lines,
wherein the terminals of at least one of the first and second groups are formed to extend along the first lines or the second lines, and
wherein positioning the terminals in the first and second groups is performed by causing the first lines to overlap with the second lines.

26. The method of manufacturing an electronic device as defined by claim 25, comprising:
positioning the terminals in the first group and the terminals in the second group by causing the first and second points to coincide with each other and relatively rotating positions of the terminals in the first and second groups about the first and second points.

27. The method of manufacturing an electronic device as defined by claim 25, comprising:
forming each of the terminals in the first group to extend along one of the first lines; and
forming each of the terminals in the second group to extend along one of the second lines.

28. A method of manufacturing an electronic device, comprising:
positioning and electrically connecting a first group of terminals and a second group of terminals, the first group of terminals being formed of at least three terminals among a plurality of first terminals of a first electronic component and the second group of terminals being formed of at least three terminals among a plurality of second terminals of a second electronic component;
disposing each of the terminals in the first group on one of a plurality of first lines passing through a first point;
disposing each of the terminals in the second group on one of a plurality of second lines passing through a second point; and
positioning and electrically connecting a third group of terminals and a fourth group of terminals, the third group of terminals being formed of at least three terminals among a plurality of third terminals of a third electronic component and the fourth group of terminals being formed of at least three terminals among the plurality of first terminals except the terminals in the first group,
wherein an arrangement of the plurality of first lines is identical with an arrangement of the plurality of second lines,
wherein the terminals of at least one of the first and second groups are formed to extend along the first lines or the second lines, and
wherein positioning the terminals in the first and second groups is performed by causing the first lines to overlap with the second lines.

29. The method of manufacturing an electronic device as defined by claim 28, comprising:
forming each of the terminals in the third group to extend along one of a plurality of third lines passing through a third point; and
forming each of the terminals in the fourth group to extend along one of a plurality of fourth lines passing through a fourth point,
wherein an arrangement of the plurality of third lines is identical with an arrangement of the plurality of fourth lines, and
wherein the third and fourth points coincide with each other and the third and fourth lines overlap to thereby position the terminals in the third group and the terminals in the fourth group.

30. The method of manufacturing an electronic device as defined by claim 29, wherein for the first electronic component, the first and fourth points coincide with each other, and the first and fourth lines overlap.

31. A method of manufacturing an electronic device, comprising:

positioning and electrically connecting a first group of terminals and a second group of terminals, the first group of terminals being formed of at least three terminals among a plurality of first terminals of a first electronic component and the second group of terminals being formed of at least three terminals among a plurality of second terminals of a second electronic component;

disposing each of the terminals in the first group on one of a plurality of first lines passing through a first point;

disposing each of the terminals in the second group on one of a plurality of second lines passing through a second point; and positioning and electrically connecting an A-group of terminals and a B-group of terminals, the A-group of terminals being formed of at least three terminals among the plurality of first terminals except the terminals in the first group, and the B-group of terminals being formed of at least three terminals among a plurality of chip terminals of a chip component, wherein an arrangement of the plurality of first lines is identical with an arrangement of the plurality of second lines, wherein the terminals of at least one of the first and second groups are formed to extend along the first lines or the second lines, and wherein positioning the terminals in the first and second groups is performed by causing the first lines to overlap with the second lines.

32. The method of manufacturing an electronic device as defined by claim 31, comprising:

forming each of the terminals in the A-group to extend along one of a plurality of lines A passing through a point A; and disposing each of the terminals in the B-group on one of a plurality of lines B passing through a point B, wherein an arrangement of the plurality of lines A is identical with an arrangement of the plurality of lines B, and wherein positioning of the terminals in the A-group and the terminals in the B-group is performed by causing the point A coincide with the point B and causing the lines A to overlap with the lines B.

33. A method of manufacturing an electronic device, comprising:

positioning and electrically connecting a first group of terminals and a second group of terminals, the first group of terminals being formed of at least three terminals among a plurality of first terminals of a first electronic component and the second group of terminals being formed of at least three terminals among a plurality of second terminals of a second electronic component;

disposing each of the terminals in the first group on one of a plurality of first lines passing through a first point; and disposing each of the terminals in the second group on one of a plurality of second lines passing through a second point, wherein an arrangement of the plurality of first lines is identical with an arrangement of the plurality of second lines, wherein the terminals of at least one of the first and second groups are formed to extend along the first lines or the second lines, and wherein positioning the terminals in the first and second groups is performed by causing the first lines to overlap with the second lines, wherein each of the terminals in the first group is formed to extend along one of the plurality of first lines, wherein the second electronic component is a chip component, and wherein at least three electrodes among a plurality of electrodes of the chip component form the second group terminals.

34. The method of manufacturing an electronic device as defined by claim 33, wherein the first electronic component includes an A-group of terminals formed of at least three terminals among the plurality of first terminals except the terminals in the first group, wherein the second electronic component includes a B-group of terminals formed of at least three terminals among the plurality of second terminals except the terminals in the second group, wherein the method further comprises:

positioning and electrically connecting the terminals in the A-group and the terminals in the B-group with one another;

forming each of the terminals in the A-group to extend along one of a plurality of lines A passing through a point A; and disposing each of the terminals in the B-group on one of a plurality of lines B passing through a point B, wherein an arrangement of the plurality of lines A is identical with an arrangement of the plurality of lines B, and wherein positioning of the terminals in the A-group and the terminals in the B-group is performed by causing the lines A to overlap with lines B.

35. The method of manufacturing an electronic device as defined by claim 33, comprising:

radially arranging the plurality of first lines passing through the first point;

radially arranging the plurality of second lines passing through the second point; and forming each of the terminals in the first group to extend radially.

36. A method of designing an electronic device, comprising:

designing a plurality of first terminals of a first electronic component and a plurality of second terminals of a second electronic component;

designing each of the terminals in a first group formed of at least three terminals among the plurality of first terminals to be disposed on one of a plurality of first lines passing through a first point so that ends of the terminals in the first group are arranged in a first position that forms a straight line; and designing each of the terminals in a second group formed of three of more terminals among the plurality of second terminals to be disposed on one of a plurality of second lines passing through a second point so that ends of the terminals in the second group are arranged in a second position that forms a straight line, wherein an arrangement of the plurality of first lines is identical with an arrangement of the plurality of second lines, and wherein the terminals in at least one of the first and second groups are designed to extend along the first lines or the second lines.

37. The method of designing an electronic device as defined by claim 36, comprising:
designing each of the terminals in the first group to extend along one of the plurality of first lines; and
designing each of the terminals in the second group to extend along one of the plurality of second lines.

38. A method of designing an electronic device, comprising:
designing a plurality of first terminals of a first electronic component and a plurality of second terminals of a second electronic component;
designing each of the terminals in a first group formed of at least three terminals among the plurality of first terminals to be disposed on one of a plurality of first lines passing through a first point;
designing each of the terminals in a second group formed of three of more terminals among the plurality of second terminals to be disposed on one of a plurality of second lines passing through a second point;
designing a plurality of third terminals of a third electronic component;
designing each of terminals in a third group formed of at least three terminals among the third terminals to extend along one of a plurality of third lines passing through a third point;
designing each of terminals in a fourth group formed of at least three terminals among the plurality of first terminals except the terminals in the first group to extend along one of a plurality of fourth lines passing through a fourth point; and
designing the plurality of third lines and the plurality of fourth lines in the same arrangement,
wherein an arrangement of the plurality of first lines is identical with an arrangement of the plurality of second lines, and
wherein the terminals in at least one of the first and second groups are designed to extend along the first lines or the second lines,
wherein each of the terminals in the first group is designed to extend along one of the plurality of first lines; and
wherein each of the terminals in the second group is designed to extend along one of the plurality of second lines.

39. The method of designing an electronic device as defined by claim 38, comprising:
designing the first and fourth points for the first electronic component to coincide with each other; and
designing the first and fourth lines to overlap.

40. The method of designing an electronic device as defined by claim 38, further comprising:
designing a plurality of chip terminals of a chip component;
designing each of terminals in an A-group formed of at least three terminals among the plurality of first terminals except the terminals in the first group to extend along one of a plurality of lines A passing through a point A;
designing each of terminals in a B-group formed of at least three terminals among the plurality of chip terminals to extend along one of a plurality of lines B passing through a point B; and designing the plurality of lines A and the plurality of lines B in the same arrangement.

41. The method of designing an electronic device as defined by claim 40, comprising:
designing the first point and the point A for the first electronic component to coincide with each other; and
designing the first lines and the lines A to overlap.

42. The method of designing an electronic device as defined by claim 40, comprising:
designing the fourth point and the point A for the first electronic component to coincide with each other; and
designing the fourth lines and the lines A to overlap.

43. The method of designing an electronic device as defined by claim 40, comprising:
designing the first point, the fourth point and the point A for the first electronic component to coincide with one another; and
designing the first lines, the fourth lines and the lines A to overlap.

44. A method of designing an electronic device, comprising:
designing a plurality of first terminals of a first electronic component and a plurality of second terminals of a second electronic component;
designing each of the terminals in a first group formed of at least three terminals among the plurality of first terminals to be disposed on one of a plurality of first lines passing through a first point; and
designing each of the terminals in a second group formed of three of more terminals among the plurality of second terminals to be disposed on one of a plurality of second lines passing through a second point,
wherein an arrangement of the plurality of first lines is identical with an arrangement of the plurality of second lines, and
wherein the terminals in at least one of the first and second groups are designed to extend along the first lines or the second lines,
wherein each of the terminals in the first group is designed to extend along one of the plurality of first lines,
wherein the second electronic component is a chip component, and
wherein at least three electrodes among a plurality of electrodes of the chip component form the second group terminals.

45. The method of designing an electronic device as defined by claim 44,
wherein the first electronic component includes an A-group of terminals formed of at least three terminals among the plurality of first terminals except the terminals in the first group,
wherein the second electronic component includes a B-group of terminals formed of at least three terminals among the plurality of second terminals except the terminals in the second group, and
wherein the method further comprises:
designing each of the terminals in the A-group to extend along one of a plurality of lines A passing through a point A;
designing each of the terminals in the B-group to be disposed on one of a plurality of lines B passing through a point B; and
designing the plurality of lines A and the plurality of lines B in the same arrangement.

46. The method of designing an electronic device as defined by claim 45, comprising:

designing the first point and the point A for the first electronic component to coincide with each other; and designing the first lines and the lines A to overlap.

47. The method of designing an electronic device as defined by claim 44, comprising:

designing the plurality of first lines to be radially arranged passing through the first point;

designing the plurality of second lines to be radially arranged passing through the second point; and designing each of the terminals in the first group to be formed to extend radially.

* * * * *